(12) United States Patent
Kyek

(10) Patent No.: US 7,772,572 B2
(45) Date of Patent: Aug. 10, 2010

(54) APPARATUS FOR PRODUCING SECONDARY ELECTRONS, A SECONDARY ELECTRODE, AND AN ACCELERATION ELECTRODE

(75) Inventor: Andreas Kyek, Sinzing (DE)

(73) Assignee: Infineon Technologies AG, Munich (DE)

( * ) Notice: Subject to any disclaimer, the term of this patent is extended or adjusted under 35 U.S.C. 154(b) by 298 days.

(21) Appl. No.: 12/063,000

(22) Filed: Apr. 4, 2008

(65) Prior Publication Data

US 2008/0185952 A1 Aug. 7, 2008

Related U.S. Application Data

(62) Division of application No. 10/718,777, filed on Nov. 21, 2003, now Pat. No. 7,417,240.

(30) Foreign Application Priority Data

Nov. 21, 2002 (DE) ................... 102 54 416

(51) Int. Cl.
*H01J 37/304* (2006.01)
(52) U.S. Cl. .................. 250/492.21; 250/251
(58) Field of Classification Search ............ 250/492.21, 250/251, 492.2
See application file for complete search history.

(56) References Cited

U.S. PATENT DOCUMENTS

| 3,395,306 | A | 7/1968 | Coles |
|---|---|---|---|
| 3,564,323 | A | 2/1971 | Maeda |
| 3,976,905 | A | 8/1976 | Seidman et al. |
| 4,093,562 | A | 6/1978 | Kishimoto |
| 4,423,354 | A * | 12/1983 | Kegelman ................ 315/12.1 |
| 4,914,292 | A | 4/1990 | Tamai et al. |
| 4,916,311 | A | 4/1990 | Fuzishita et al. |
| 5,138,169 | A | 8/1992 | Yamazaki et al. |
| 5,164,599 | A | 11/1992 | Benveniste |
| 6,043,499 | A | 3/2000 | Seki et al. |
| 2004/0104657 | A1 | 6/2004 | Kyek |

FOREIGN PATENT DOCUMENTS

| DE | 1808659 | 6/1969 |
|---|---|---|
| DE | 2707416 | 9/1977 |
| GB | 503211 | 6/1937 |
| JP | 60079655 A | 5/1985 |
| JP | 62058536 A | 3/1987 |
| JP | 63126147 A | 5/1988 |
| JP | 401274350 | 11/1989 |
| JP | 06267493 A | 9/1994 |

* cited by examiner

*Primary Examiner*—Kiet T Nguyen
(74) *Attorney, Agent, or Firm*—Laurence A. Greenberg; Werner H. Stemer; Ralph E. Locher

(57) ABSTRACT

An apparatus includes a primary electrode and an acceleration electrode. The acceleration electrode or, alternatively, an additional secondary electrode contains a slot that extends obliquely through the acceleration electrode or through the secondary electrode. This measure allows secondary electrons to be produced in a highly effective manner.

31 Claims, 3 Drawing Sheets

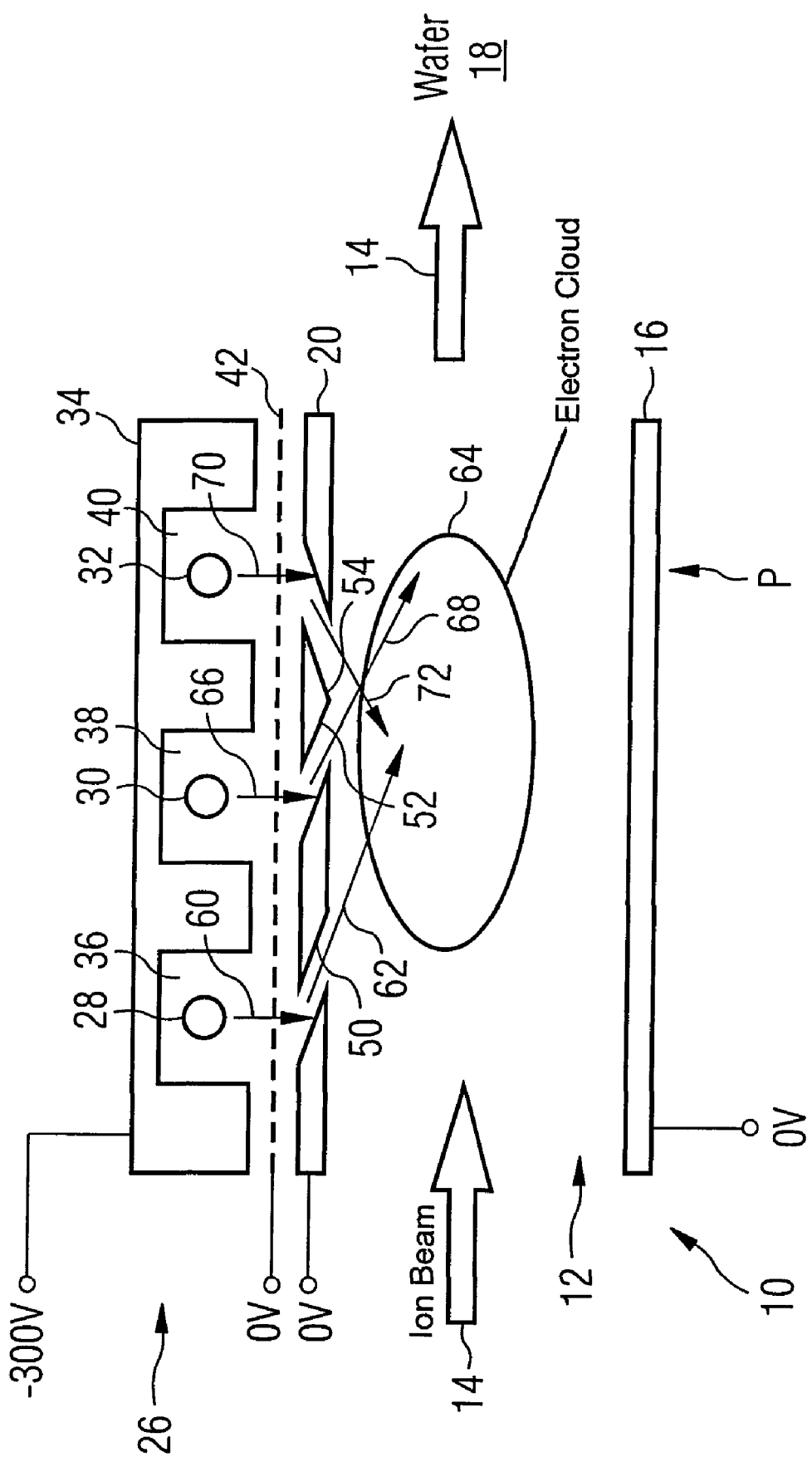

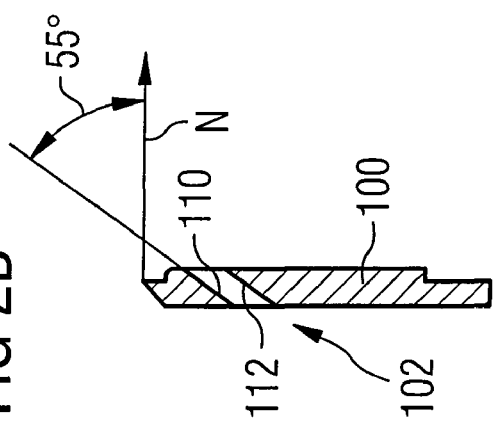
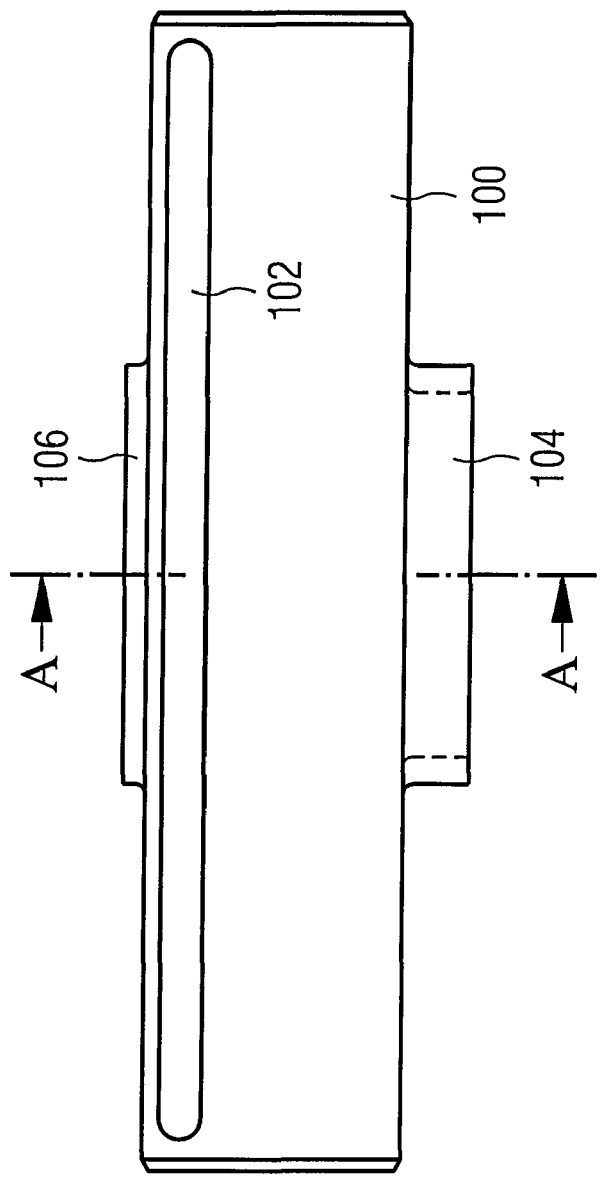

APPARATUS FOR PRODUCING SECONDARY ELECTRONS, A SECONDARY ELECTRODE, AND AN ACCELERATION ELECTRODE

CROSS-REFERENCE TO RELATED APPLICATION

This application is a divisional of copending U.S. patent application Ser. No. 10/718,777, filed on Nov. 21, 2003, which claims priority from German Patent Application 102 54 416.6 filed on Nov. 21, 2002, those applications being incorporated herein, by reference.

BACKGROUND OF THE INVENTION

Field of the Invention

The invention relates to an apparatus for producing secondary electrons. The apparatus includes a primary electrode used for producing primary electrons, and an acceleration electrode used for accelerating the primary electrons.

The apparatus is, for example, arranged in a free space used, for example, for an ion beam to pass through, for holding a plasma and/or for holding a workpiece or a material to be processed.

The ion beam contains, for example, boron, phosphorus or arsenic ions. In a plasma, electrons are extracted from atoms so that the ions which are produced in the process have positive charges. Positively charged ions are also referred to as cations.

The primary electrode is, for example, a very thin wire with a very small radius of curvature. The radius of curvature results in a corona discharge. Only charges of the same polarity as the electrode are produced, because of the corona discharge, at a sufficient distance from the primary electrode. This means that the primary electrode has a negative potential in order to produce electrons. By way of example, the diameter of the primary electrode wire is 30 μm (micrometers).

The acceleration electrode is at a different potential than the primary electrode, for example at ground potential. The electric field which is formed between the acceleration electrode and the primary electrode accelerates the primary electrons toward the acceleration electrode. The primary electrodes pass through openings in the acceleration electrode, and retain their direction because of the lack of any electric acceleration field downstream from the acceleration electrode.

By way of example, apparatuses such as these for producing secondary electrons are used in ion implantation systems for producing integrated circuits, in order to counteract charges that can occur on a wafer due to the cations.

BRIEF SUMMARY OF THE INVENTION

It is accordingly an object of the invention to provide an apparatus for producing secondary electrons, which effectively counteracts charges, or effectively prevents such charges. Further objects of the invention are to provide a secondary electrode and an acceleration electrode that can be used in an apparatus for producing secondary electrons.

The invention is based on the idea that the primary electrons have comparatively high energy, for example, several hundred electron volts (eV), because of the acceleration voltage. The high energy makes it possible, for example, for the primary electrons which reach a semiconductor wafer directly to produce a strong negative charge there, which is likewise not wanted. For example, the primary electrons can be carried by an ion beam. In order to prevent such processes or similar processes, in a first embodiment of the apparatus, the acceleration electrode contains at least one aperture opening, which extends obliquely through the acceleration electrode. The primary electrons thus arrive at a side wall of the aperture opening before they leave the apparatus and, for example, reach free space. Furthermore, when the primary electrons arrive, they produce secondary electrons which have comparatively low energy. In addition, the aperture opening has a greater length than the material thickness of the electrode, since it is at an inclined angle.

Based on the first embodiment of the apparatus, a secondary electrode is constructed to perform the function of an acceleration electrode in addition to other functions. The secondary electrode has three functions:
  producing the acceleration voltage;
  producing secondary electrons; and
  interrupting the direct path for primary electrons to the exterior, for example, to free space.

In a second embodiment of the invention, the apparatus for producing secondary electrons contains a separate acceleration electrode for accelerating the primary electrons emitted by a primary electrode. In this case, the secondary electrode produces secondary electrons when accelerated primary electrons arrive. The secondary electrode is preferably arranged on the side of the acceleration electrode which faces away from the primary electrode. The secondary electrode is thus located between the acceleration electrode and free space. Primary electrons arrive at the secondary electrode, and produce secondary electrons. Because the secondary electrode is physically separated from the acceleration electrode, the secondary electrons pass to the exterior, for example to free space, without being disturbed by the electric field for producing and accelerating the primary electrons. Since the secondary electrode is also located on the same side of free space as the primary electrode, the number of primary electrons which will reach free space is reduced.

In one development based on the second embodiment of the apparatus, the secondary electrode contains at least one aperture opening, which extends obliquely through the secondary electrode. This development is based on the same ideas as the first embodiment of the invention. The secondary electrode has two functions:
  producing the secondary electrons when primary electrons arrive; and
  interrupting the direct path for primary electrons to the exterior, for example to free space.

Other measures in order to use the aperture opening to impede the passage of primary electrons or to prevent them from passing through may also be taken instead of or in addition to an aperture opening which extends obliquely through the acceleration electrode or through the secondary electrode. For example, an electrode having an aperture opening which runs in the normal direction to the electrode surface can be inclined with respect to free space or to the ion beam or can be arranged with a specific offset from the aperture opening and primary electrode, in order to prevent primary electrons from passing through and thus to achieve the same effects as those explained above.

In one development which is applicable to both aspects, the aperture opening is an elongated hole which preferably extends parallel to the primary electrode or to a wire of the primary electrode. The elongated hole can be produced in a simple manner, for example, using a milling machine. Oblique elongated holes can also be produced without any problems by using a milling machine. Alternatively, laminates are used.

In one refinement, the side surfaces of the aperture opening overlap one another or are aligned with the arrival direction at which the majority of primary electrons reach the aperture opening. An aligned arrangement ensures that, on the one hand, no primary electrons can reach the exterior, for example, free space, directly, and that, on the other hand, the impact surface in the aperture opening is large in comparison to the length of the aperture opening. In consequence, a large number of secondary electrons can pass to the exterior, for example, to free space, through the aperture opening in a simple manner.

In one development, the aperture opening is arranged inclined at an angle of between 30° and 70° to the surface normal of the electrode in the area of the aperture opening. The appropriate angle depends on the thickness of the electrode. For example, an angle of 55° is particularly suitable for a thickness of about 5 mm. In one refinement, the angle is defined by:

$$\tan(90°-w)=d/b,$$

where w is the angle, d is the thickness of the electrode with the aperture opening, and b is the width of the aperture opening.

In one refinement, the distance between the side walls of the aperture opening is between 2 mm and 6 mm. The appropriate distance once again depends on the thickness of the electrode with the aperture opening. For example, a distance between the side walls of 4 mm is particularly suitable for an electrode thickness of about 5 mm and an inclination angle of 55°.

In another development, only one aperture opening is provided for each primary electrode. This results in a physically simple apparatus. In one refinement, the apparatus contains only one primary electrode. This measure further simplifies the configuration of the apparatus.

Alternatively, however, the apparatus contains two or more primary electrodes, each of which has at least one associated aperture opening. The use of aperture openings with different aperture directions means that secondary electrons which are produced by the primary electrons from different primary electrodes can be concentrated at a specific point outside the apparatus, for example, in an electron cloud in free space. While the physical length and the neutralization effect remain the same, this ensures that fewer primary electrons can, for example, reach the impact location of the ion beam, that is to say, for example, the semiconductor wafer or a material to be irradiated.

In another development, aluminum, an aluminum alloy, graphite, a graphite compound or aluminum oxide $Al_2O_3$ is used as the material for the electrode with the aperture opening. Aluminum Al and graphite C have a yield of 1, or else of the order of magnitude of 1, with an energy of 300 eV. This means that every primary electron that arrives produces a secondary electron. The yield is also referred to as the secondary electron emission coefficient. The secondary electron emission coefficient of aluminum oxide is at least twice as great as that of aluminum or graphite.

A roughened surface on the electrode with the aperture opening leads to greater secondary electron emission. In one refinement, the mean roughness of the surface is 6.3 μm.

In another development with a separate acceleration electrode and a secondary electrode, the acceleration electrode contains more than 100 openings, more than 500 openings, or even more than 1000 openings. The openings are, for example, holes with a diameter of about 1 mm. However, wire meshes may also be used as an alternative.

In one development, aluminum or an aluminum alloy is used as the material for the acceleration electrode. In one refinement, aluminum with a purity of 99.9% or more than 99.9% is used. This material is particularly suitable for use as the electrode material for producing integrated circuit arrangements. The mean surface roughness of the acceleration electrode in one refinement is 4.3 μm, that is to say the acceleration electrode is smoother than the secondary electrode.

In one development, the primary electrode or the primary electrodes is or are arranged parallel to the propagation direction of the ion beam. This type of arrangement is used in particular for so-called high-current ion implantation systems. The ion beam current in these systems is greater than 1 mA. For example, the ion current is in the range between 1 and 25 mA. In one development, the primary electrodes may, for example, be arranged around the ion beam.

In an alternative development, the primary electrode or the primary electrodes is or are arranged transversely with respect to the propagation direction of the ion beam, preferably at an angle of 90°. This arrangement is particularly suitable for systems in which the ion beam is, for example, guided in the form of a scanning movement, that is to say it is scanned. A scanning movement such as this is used in particular for medium-current ion implantation systems, in which the ion current has values of less than 1 mA. However, high-current ion implantation systems also exist in which the ion beam carries out a scanning movement.

The invention also relates to a secondary electrode having the features of the secondary electrodes mentioned above, that is to say in particular with an aperture opening which extends obliquely through the secondary electrode. The technical effect described above thus also applies to the secondary electrode.

The invention additionally relates to an acceleration electrode which, in particular, has the features of the acceleration electrode mentioned above. In particular, the acceleration electrode contains more than 100 openings, more than 500 openings or more than 1000 openings. The technical effects mentioned above thus likewise apply to this acceleration electrode.

By way of example, the inventive apparatus or the inventive electrode can be used in a simple manner in an ion implantation system of the EATON implanter type, in particular in a system of the NV 8250 P type. The dimensions stated below relate to this type of system. However, other types of systems can also be modified in a similar way in order to use the invention.

Other features which are considered as characteristic for the invention are set forth in the appended claims.

Although the invention is illustrated and described herein as embodied in an apparatus for producing secondary electrons, in particular a secondary electrode and an acceleration electrode, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 1 is a view of an apparatus for producing secondary electrons using a corona discharge;
FIGS. 2A and 2B are views of a secondary electrode.

DETAILED DESCRIPTION OF THE INVENTION

Figure 3:
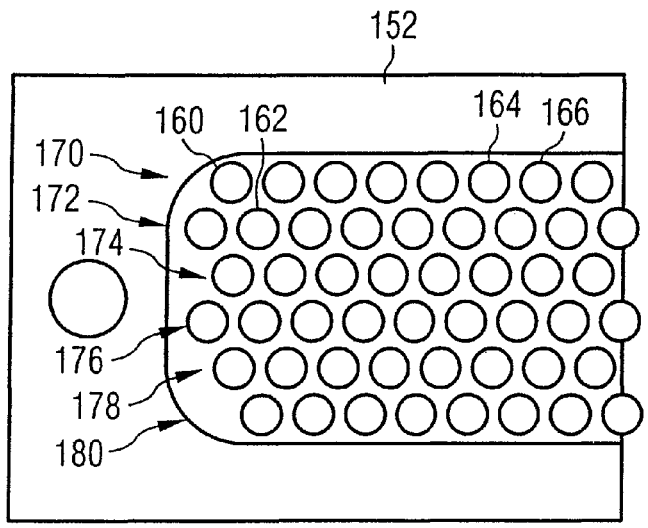
FIG. 3 is a plan view of an acceleration electrode.
Figure 4:
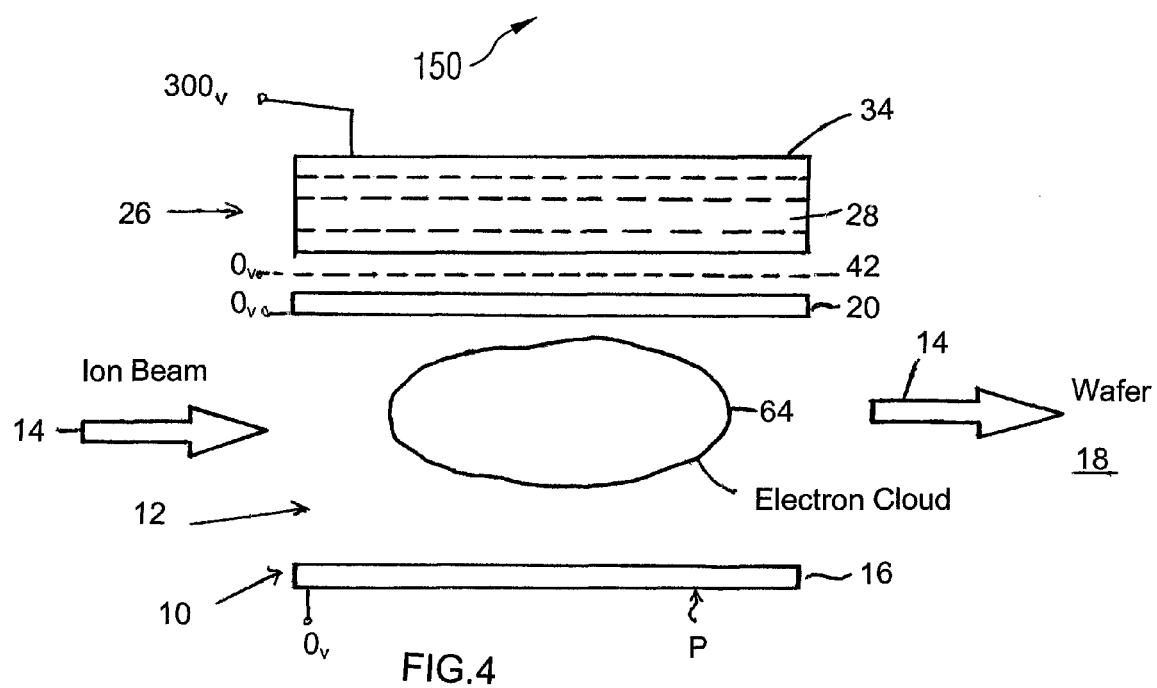
FIG. 4 is a view of the apparatus for producing secondary electrons using a corona discharge, showing the primary electrode configured parallel to the ion beam.

Referring now to the figures of the drawing in detail and first, particularly, to FIG. 1 thereof, there is shown a configuration of an electron production apparatus 10 which contains an aperture area 12 or a chamber for an ion beam 14 to pass through. The ion beam 14 is produced using non-illustrated units of an ion implantation system, specifically by using an ion source, for example, an RF (radio frequency) source, a mass separator arrangement, for example, a magnet, and an acceleration path.

Before or after passing through the aperture area 12, the ion beam 14 is deflected, for example, using a deflection system, so that it carries out a scanning movement.

The aperture area 12 is bounded at the bottom by a shielding pivoting electrode 16. The pivoting electrode 16 is mounted such that it can pivot about a point P. When the production apparatus 10 is in a normal mode of operation, the pivoting electrode 16 is in the position illustrated in FIG. 1, that is to say the ion beam 14 can pass through the aperture area 12 without any impediment. Conversely, in a test operating mode, the pivoting electrode 16 is pivoted upwards into the aperture area 12, so that the ion beam 14 can no longer strike a wafer 18.

The aperture area 12 is bounded at the top by a secondary electrode 20 which extends parallel to the pivoting electrode 16 in the normal operating mode. The configuration of the secondary electrode 20 will be explained in more detail below.

A primary electron production apparatus 26, which is used for producing primary electrons, is arranged a short distance away on the outside of the secondary electrode 20. The electron production apparatus 26 contains three glow wires 28, 30 and 32, which are arranged in a row parallel to one another, for example, with uniform spacings between them. The glow wires 28, 30 and 32 run at an angle of 90° with respect to the propagation direction of the ion beam 14. The glow wires 28, 30 and 32 are surrounded by a triple reflector 34, which has three mutually separated cutouts 36, 38 and 40. A respective glow wire 28, 30 and 32 extends in the center of each cutout 36, 38, and 40. An acceleration electrode 42, which lies in a plane, is, for example, a grating formed by holes or a wire mesh. The acceleration electrode 42 is located opposite the openings of the cutouts 36, 38, and 40 and at a short distance from the triple reflector 34.

The pivoting electrode 16, the secondary electrode 20 and the acceleration electrode 42 are, in the exemplary embodiment, composed of aluminum. The glow wires 28 to 32 are composed, for example, of tungsten. Aluminum is likewise suitable as the material for the triple reflector 34.

The secondary electrode 20 contains three slots 50, 52 and 54 which are arranged obliquely in the secondary electrode 20 and are adjacent to the glow wires 28, 30 and 32, in this sequence. The slots 50 and 52 are thus located closer to the point at which the ion beam 14 enters the aperture area 12 than the slot 54. The side walls of the slots 50 and 52 are parallel to one another. The side walls of the slots 50 and 52 thus define an angle of −60° with respect to a normal to the surface of the secondary electrode 20 which faces away from the aperture area 12. In this case, minus means that the angle from the normal runs in a counterclockwise direction. The side walls of the slot 54 are parallel to one another, but are inclined in a direction which opposes the inclination direction of the side walls of the slots 50 and 52. The side walls of the slot 54 thus define an angle of +60° with respect to the normal to the surface of the secondary electrode 20 which faces away from the aperture area 12. The thickness of the secondary electrode 20 and the angle are of such magnitudes that pointed edges of the slots 50, 52 and 54 are each aligned with one another in the direction of the normal to the surface of the secondary electrode 20. Inlet openings in the slots 50, 52 and 54 are arranged opposite the glow wires 28, 30 and 32, in this sequence.

A potential of −300 V (volts) is applied to the triple reflector 34 and to the glow wires 28 to 32. A voltage which is superimposed on this potential, in particular a DC voltage of, for example, 30 volts, leads to a current flow which causes the glow wires 28 to 32 to glow. Then, by way of example, 5 A (amperes) per glow wire 28 to 32 flows through the glow wires 28 to 32. There is a potential of 0 V on the pivoting electrode 16, on the secondary electrode 20 and on the acceleration electrode 42. Thus, for example, the primary electrons are accelerated from the glowing filament 28 to the side surface of the slot 50 which is located closer to the entry point of the ion beam 14. As a result of passing through the acceleration electrode 42, these primary electrons 60 arrive at this side surface, where each of them produces a secondary electron. The second electrons 62 which are produced in this way are attracted by the ion beam 14 and, because of the directional effect of the slot 50, arrive in an electron cloud 64 on a path that is inclined with respect to the propagation direction of the ion beam.

Primary electrons 66 pass in the same way from the glow wire 30 through the acceleration electrode 42 to the side surface of the slot 52 which is closer to the entry point of the ion beam 14. The primary electrons 66 produce secondary electrons 68, which are attracted by the ion beam 14, and enter the electron cloud 64.

Primary electrons 70 are accelerated from the glow wire 32 towards the acceleration electrode 42. The primary electrons 70 pass through the acceleration electrode 42 and reach the side surface of the slot 54 which is further away than the point at which the ion beam 14 enters the aperture area 12. The primary electrons 70 produce secondary electrons 72, which likewise enter the electron cloud 64. While the secondary electrons 62 and 68 mainly enter the electron cloud 64 parallel to one another, the secondary electrons 72 are in the opposite direction to the secondary electrons 62 and 68, because of the different inclination direction of the slot 54. Primary electrons 70 which pass randomly through the slot 54 are also directed away from the wafer 18 due to the inclination of the slot 54.

FIG. 2A shows a secondary electrode 100 for an EATON implanter of the NV-8250 type, that is to say in particular for 6-inch wafer implantations or, after conversion, for 8-inch wafer implantations. The secondary electrode 100 is used instead of the secondary electrode 20 in an electron production apparatus which contains only one glow wire. A slot 102 which is arranged in the secondary electrode 100 corresponds, for example, to the slot 50, 52 or 54. The secondary electrode 100 has a rectangular base body, on whose longitudinal faces two attachment webs 104 and 106 are arranged centrally. The attachment webs 104 and 106 have a length which corresponds approximately to ⅓ of the length of the base body of the secondary electrode 100. The attachment web 104 projects about 10 mm beyond the base body of the secondary electrode 100. In contrast, the attachment web 106 projects only about 3 mm beyond the base body of the secondary electrode 100. The base body of the secondary electrode 100 has length of 162 mm and a width of about 36 mm. An opening of the slot 102 extends close to the attachment web 106, virtually over the entire length of the base body. In the exemplary embodiment, the length of the slot 102 without including rounded areas at the ends of the slot 102 is 150 mm.

FIG. 2A also shows a section plane A in the center of the secondary electrode 100. The section plane A is located transversely with respect to the longitudinal axis of the secondary electrode 100.

FIG. 2B shows the secondary electrode 100 along the cross section lying in the section plane A. The thickness of the secondary electrode 100 is about 5 mm. As is illustrated in FIG. 2B, side walls 110 and 112 of the slot 102 are inclined at an angle of −55° with respect to a normal N. The distance between the side walls 110 and 112 is 4 mm.

The secondary electrode 100 is composed of aluminum, that is to say, of the material Al 99. The mean roughness of the surface is 6.3 μm.

FIG. 3 shows an acceleration electrode 150 which is used instead of the acceleration electrode 42 in the same system in which the secondary electrode 100 is also used. The acceleration electrode 150 has a length of 162 mm and a width of 11 mm. A large number of holes 160 to 166, for example, more than 500 holes, are located within a frame 152. The holes 160 to 166 each have a diameter of 1 mm, and are arranged in six rows 170 to 180 which run parallel to one another. The holes 160, 162 of two adjacent rows 170, 172 are offset by 0.65 mm with respect to one another. The distances between the inner rows 174 and 176, between the central rows 172, 178 and between the outer rows 170 and 180 are 1.13 mm, 3.38 mm and 5.63 mm, respectively. Mutually adjacent holes 164, 166 within one row 170 to 180 each have a separation of 1.3 mm between the center points of the holes 164 and 166.

The acceleration electrode 150 is illustrated greatly enlarged in FIG. 3. The acceleration electrode 150 is composed of aluminum Al 99.9, so that only a small number of stray atoms emerge from the acceleration electrode 150. Implantation processes can thus be carried out with a high yield. The mean roughness of the surface is 4.3 μm. The thickness of the frame 152 is 1.5 mm. The acceleration electrode 150 has a thickness of 1 mm within the frame 152.

In another exemplary embodiment, the electron production apparatus 10 has no acceleration electrode 42. The functions of the acceleration electrode 42 are then additionally carried out by the secondary electrode 20.

In a further exemplary embodiment, laminates which, for example, are held in a frame are used instead of the oblique slots. Two adjacent laminates each form one aperture opening, which extends obliquely through the frame. Each laminate is an elongated thin metal platelet, for example, composed of aluminum.

The invention claimed is:

1. An apparatus for producing secondary electrons, comprising:
   at least one primary electrode for producing primary electrons;
   an acceleration electrode for accelerating the primary electrons;
   a secondary electrode for producing secondary electrons when the accelerated primary electrons arrive; and
   there being a potential of 0 V on the secondary electrode and on the acceleration electrode.

2. The apparatus according to claim 1, wherein:
   said secondary electrode is formed with at least one aperture opening;
   said aperture opening extends obliquely through said secondary electrode and/or said aperture opening prevents primary electrons from passing through.

3. The apparatus according to claim 2, wherein said aperture opening is formed by an elongated hole defined by side surfaces configured parallel to one another.

4. The apparatus according to claim 2, wherein:
   said aperture opening is defined by side surfaces that overlap in a direction at which the primary electrons arrive into said aperture opening.

5. The apparatus according to claim 2, wherein:
   said secondary electrode has a surface in which said aperture opening is formed;
   said surface has a normal; and
   said side surfaces of said aperture opening are configured aligned with said normal.

6. The apparatus according to claim 2, wherein said aperture opening is formed by laminates.

7. The apparatus according to claim 1, wherein:
   said secondary electrode is formed with at least one aperture opening having an aperture direction configured at an angle of a magnitude of between 30° and 70° with respect to a normal of said secondary electrode near said aperture opening.

8. The apparatus according to claim 7, wherein:
   said angle has a magnitude of 55° with respect to the normal of said secondary electrode near said aperture opening.

9. The apparatus according to claim 1, wherein:
   said secondary electrode is formed with at least one aperture opening having an aperture direction configured at an angle defined by: $\tan(90°-w)=d/b$; and
   w is said angle, d is a thickness of said secondary electrode, and b is a width of said aperture opening.

10. The apparatus according to claim 1, wherein:
    said secondary electrode has side walls defining an aperture opening;
    said side walls are spaced a distance apart; and
    said distance between said side walls is between 2 mm and 6 mm.

11. The apparatus according to claim 10, wherein said distance between said side walls is 4 mm.

12. The apparatus according to claim 1, wherein:
    said at least one primary electrode includes only one primary electrode.

13. The apparatus according to claim 1, further comprising:
    a plurality of primary electrodes;
    said secondary electrode formed with a plurality of aperture openings;
    each one of said plurality of primary electrodes associated with a respective one of said plurality of aperture openings; and
    at least one of said plurality of aperture openings being at a different inclination angle than another one of said plurality of aperture openings.

14. The apparatus according to claim 1, wherein:
said secondary electrode is formed with at least one aperture opening;
said secondary electrode is made of aluminum or of an aluminum alloy.

15. The apparatus according to claim 1, wherein:
said secondary electrode is made of Al 99 or of an even purer aluminum.

16. The apparatus according to claim 1, wherein:
said secondary electrode is formed with at least one aperture opening; and
said secondary electrode is made of graphite or contains at least 60% by mass of graphite.

17. The apparatus according to claim 1, wherein:
said secondary electrode is formed with at least one aperture opening; and
said secondary electrode is made of aluminum oxide.

18. The apparatus according to claim 1, wherein:
said secondary electrode is formed with at least one aperture opening; and
said secondary electrode has a mean surface roughness of between 5 and 8 µm.

19. The apparatus according to claim 1, wherein:
said acceleration electrode is formed with at least 100 openings.

20. The apparatus according to claim 19, wherein:
said acceleration electrode includes a wire mesh having at least 100 holes or meshes.

21. The apparatus according to claim 1, wherein:
said acceleration electrode is formed at least 500 openings.

22. The apparatus according to claim 1, wherein:
said acceleration electrode is formed with at least 1000 openings.

23. The apparatus according to claim 1, wherein:
said acceleration electrode is formed with at least 100 openings; and
said acceleration electrode is made of aluminum or an aluminum alloy.

24. The apparatus according to claim 1, wherein:
said acceleration electrode is formed with at least 100 openings; and
said acceleration electrode is made of Al 99.9 or an even purer aluminum.

25. The apparatus according to claim 1, wherein:
said acceleration electrode is formed with at least 100 openings; and
said secondary electrode has a mean surface roughness; and
said acceleration electrode has a mean surface roughness of less than said mean surface roughness of said secondary electrode.

26. The apparatus according to claim 25, wherein:
said mean surface roughness of said acceleration electrode is between 2.5 and 6 µm.

27. The apparatus according to claim 1, further comprising:
a free space for an ion beam to pass through; and
a workpiece;
said ion beam being directed at said workpiece.

28. The apparatus according to claim 27, wherein said workpiece is a semiconductor substrate.

29. The apparatus according to claim 1, further comprising:
a free space used for holding a material or workpiece to be processed.

30. The apparatus according to claim 1, further comprising:
a free space for an ion beam to pass through;
said primary electrode configured parallel to a propagation direction of said ion beam.

31. The apparatus according to claim 1, further comprising:
a free space for an ion beam to pass through;
said primary electrode configured transversely with respect to a propagation direction of said ion beam.

* * * * *